US012656401B2

(12) United States Patent
Duan et al.

(10) Patent No.: US 12,656,401 B2
(45) Date of Patent: Jun. 16, 2026

(54) TRACTION BATTERY CONTROLLER EMPLOYING BATTERY MODEL THAT EFFICIENTLY REPRESENTS COMPLEX BATTERY DIFFUSION DYNAMICS

(71) Applicant: Ford Global Technologies, LLC, Dearborn, MI (US)

(72) Inventors: Xiaohong Nina Duan, Canton, MI (US); Yonghua Li, Ann Arbor, MI (US); Hao Wu, Northville, MI (US); Donnell Matthew Washington, II, Northville, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 516 days.

(21) Appl. No.: 18/358,084

(22) Filed: Jul. 25, 2023

(65) Prior Publication Data

US 2025/0035704 A1 Jan. 30, 2025

(51) Int. Cl.
*G01R 31/367* (2019.01)
*B60L 58/13* (2019.01)

(52) U.S. Cl.
CPC ............ *G01R 31/367* (2019.01); *B60L 58/13* (2019.02); *B60L 2240/545* (2013.01); *B60L 2240/547* (2013.01)

(58) Field of Classification Search
CPC . G01R 31/367; B60L 58/13; B60L 2240/545; B60L 2240/547; B60L 58/12; B60L 2240/549; B60L 2260/44; B60L 50/60; B60L 58/10; H01M 10/48; H01M 2220/20
See application file for complete search history.

(56) References Cited

U.S. PATENT DOCUMENTS

| | | | | |
|---|---|---|---|---|
| 5,381,096 A | * | 1/1995 | Hirzel ................ | G01R 31/367 |
| | | | | 340/636.15 |
| 6,534,954 B1 | | 3/2003 | Plett | |
| 8,880,253 B2 | | 11/2014 | Li et al. | |
| 2012/0179435 A1 | | 7/2012 | Song et al. | |
| 2014/0244225 A1 | * | 8/2014 | Balasingam ....... | G01R 31/3835 |
| | | | | 703/2 |
| 2016/0363629 A1 | | 12/2016 | Frost et al. | |
| 2021/0359317 A1 | | 11/2021 | Kaushik et al. | |
| 2022/0212545 A1 | | 7/2022 | Araujo Xavier et al. | |
| 2022/0305952 A1 | | 9/2022 | Klintberg et al. | |

FOREIGN PATENT DOCUMENTS

| | | | | |
|---|---|---|---|---|
| CN | 106814329 A | 6/2017 | | |
| JP | 2018055402 A | 4/2018 | | |
| WO | WO 2016106501 A1 | * | 7/2016 ........... | G01R 31/389 |

* cited by examiner

*Primary Examiner* — Tung S Lau
(74) *Attorney, Agent, or Firm* — David B. Kelley; Brooks Kushman P.C.

(57) ABSTRACT

A system, such an electrified vehicle, includes a battery, such as a traction battery. The system further includes a controller configured to control the battery based on (i) a value of a first parameter of a model of the battery taken from electrical measurements of the battery and (ii) a value of a second parameter of the model, dependent on the value of the first parameter, taken from the value of the first parameter.

12 Claims, 6 Drawing Sheets

*(Background)*

(Background)

(Background)

(Background)

(Background)

1

TRACTION BATTERY CONTROLLER EMPLOYING BATTERY MODEL THAT EFFICIENTLY REPRESENTS COMPLEX BATTERY DIFFUSION DYNAMICS

TECHNICAL FIELD

The present disclosure relates to detecting operating characteristics of a traction battery of an electrified vehicle.

BACKGROUND

An electrified vehicle includes a traction battery for providing power to a motor of the vehicle to propel the vehicle. Operating characteristics of the traction battery, such as the power capability of the traction battery and the state-of-charge of the traction battery, may be monitored in controlling the operation of the traction battery and/or the vehicle.

SUMMARY

A system includes a battery and a controller. The controller is configured to control the battery based on (i) a value of a first parameter of a model of the battery taken from electrical measurements of the battery and (ii) a value of a second parameter of the model, dependent on the value of the first parameter, taken from the value of the first parameter.

The controller may be further configured to control the battery based on (i) the value of the first parameter, (ii) the value of the second parameter, and (iii) a value of one or more additional parameters of the model, dependent on the value of the first parameter, taken from the value of the first parameter.

The first parameter, the second parameter, and the one or more additional parameters may be indicative at least in part of a Warburg impedance of the model.

The first parameter may be a circuit element of a first resistor-capacitor (RC) circuit and the second parameter may be a circuit element of a second RC circuit in which case the first RC circuit has a time constant that is smaller than a time constant of the second RC circuit.

The first parameter may be a resistor of the first RC circuit in which case the value of the first parameter is a value of a resistance of the resistor of the first RC circuit and the second parameter may be a resistor of the second RC circuit in which case the value of the second parameter is a value of a resistance of the resistor of the second RC circuit.

The first parameter may be a capacitor of the first RC circuit in which case the value of the first parameter is a value of a capacitance of the capacitor of the first RC circuit and the second parameter may be a capacitor of the second RC circuit in which case the value of the second parameter is a value of a capacitance of the capacitor of the second RC circuit.

The first parameter may be a time constant of a first RC circuit in which case the value of the first parameter is a value of a time of the time constant of the first RC circuit and the second parameter may be a time constant of a second RC circuit in which case the value of the second parameter is a value of a time of the time constant of the second RC circuit in which case the time constant of the RC circuit is smaller than the time constant of the second RC circuit.

The dependence of the value of the second parameter on the value of the first parameter may change with changes in a temperature of the battery, a current of the battery, and/or a state-of-charge (SOC) of the battery.

The electrical measurements of the battery include voltage and/or current and/or temperature measurements of the battery.

A system of a vehicle having a traction battery includes a sensor and a controller. The sensor is configured to sense electrical measurements of the traction battery. The controller is configured to control the traction battery based on (i) a value of a first resistor-capacitor (RC) circuit of an equivalent circuit model (ECM) of the traction battery taken from the electrical measurements of the traction battery and (ii) a value of a second RC circuit of the ECM, dependent on the value of the first RC circuit, taken from the value of the first RC circuit.

The controller may be further configured to the traction battery based on (i) the value of the first RC circuit, (ii) the value of the second RC circuit, and (iii) a value of one or more additional RC circuits of the ECM, dependent on the value of the first parameter, taken from the value of the first RC circuit.

The first RC circuit, the second RC circuit, and the one or more additional RC circuits may be indicative at least in part of a Warburg impedance of the ECM.

The first RC circuit may have a smallest time constant amongst all of the RC circuits. The second RC circuit may have a smallest time constant amongst all of the RC circuits other than the first RC circuit.

A method includes sensing electrical measurements of a traction battery of a vehicle. The method further includes controlling, by a controller, the traction battery based on (i) a value of a first parameter of an equivalent circuit model (ECM) of the traction battery taken from the electrical measurements of the traction battery and (ii) a value of a second parameter of the ECM, dependent on the value of the first parameter, taken from the value of the first parameter of the ECM.

<div style="text-align:center">DETAILED DESCRIPTION</div>

Detailed embodiments of the present disclosure are disclosed herein; however, it is to be understood that the disclosed embodiments are merely exemplary of the present disclosure that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present disclosure.

Figure 1:
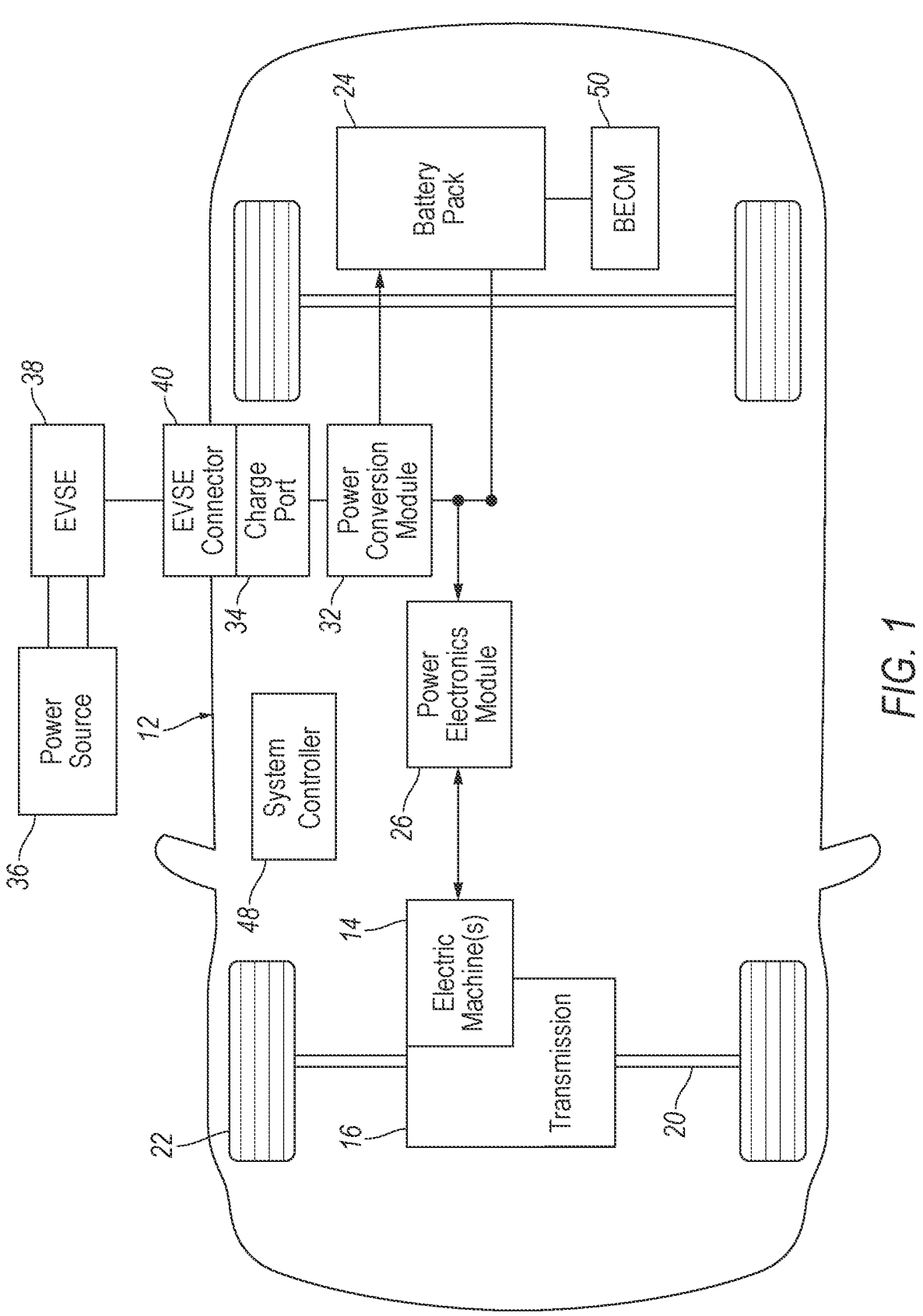
FIG. 1 illustrates a block diagram of a battery electric vehicle (BEV)

Referring now to FIG. 1, a block diagram of an electrified vehicle (EV) 12 in the form of a battery electric vehicle (BEV) is shown. BEV 12 includes a powertrain having one or more traction motors ("electric machine(s)") 14, a traction battery ("battery" or "battery pack") 24, and a power electronics module 26 (e.g., an inverter). In the BEV configuration, traction battery 24 provides all of the propulsion power and the vehicle does not have an engine. In other variations, the EV may be a plug-in (or regular) hybrid electric vehicle (HEV) further having an engine.

Traction motor 14 is part of the powertrain of BEV 12 for powering movement of the BEV. In this regard, traction motor 14 is mechanically connected to a transmission 16 of BEV 12. Transmission 16 is mechanically connected to a drive shaft 20 that is mechanically connected to wheels 22 of BEV 12. Traction motor 14 can provide propulsion capability to BEV 12 and is capable of operating as a generator. Traction motor 14 acting as a generator can recover energy that may normally be lost as heat in a friction braking system of BEV 12.

Traction battery 24 stores electrical energy that can be used by traction motor 14 for propelling BEV 12. Traction battery 24 typically provides a high-voltage (HV) direct current (DC) output. Traction battery 24 is electrically connected to power electronics module 26. Traction motor 14 is also electrically connected to power electronics module 26. Power electronics module 26, such as an inverter, provides the ability to bi-directionally transfer energy between traction battery 24 and traction motor 14. For example, traction battery 24 may provide a DC voltage while traction motor 14 may require a three-phase alternating current (AC) current to function. Inverter 26 may convert the DC voltage to a three-phase AC current to operate traction motor 14. In a regenerative mode, inverter 26 may convert three-phase AC current from traction motor 14 acting as a generator to DC voltage compatible with traction battery 24.

In addition to providing electrical energy for propulsion of BEV 12, traction battery 24 may provide electrical energy for use by other electrical systems of the BEV such as HV loads like electric heater and air-conditioner systems and low-voltage (LV) loads such as an auxiliary battery.

Traction battery 24 is rechargeable by an external power source 36 (e.g., the grid). External power source 36 may be electrically connected to electric vehicle supply equipment (EVSE) 38. EVSE 38 provides circuitry and controls to control and manage the transfer of electrical energy between external power source 36 and BEV 12. External power source 36 may provide DC or AC electric power to EVSE 38. EVSE 38 may have a charge connector 40 for plugging into a charge port 34 of BEV 12.

A power conversion module 32 of EV 12, such as an on-board charger having a DC/DC converter, may condition power supplied from EVSE 38 to provide the proper voltage and current levels to traction battery 24. Power conversion module 32 may interface with EVSE 38 to coordinate the delivery of power to traction battery 24.

The various components described above may have one or more associated controllers to control and monitor the operation of the components. The controllers can be microprocessor-based devices. The controllers may communicate via a serial bus (e.g., Controller Area Network (CAN)) or via discrete conductors.

For example, a system controller 48 ("vehicle controller") is present to coordinate the operation of the various components. Controller 48 includes electronics, software, or both, to perform the necessary control functions for operating BEV 12. Controller 48 may be a combination vehicle system controller and powertrain control module (VSC/PCM). Although controller 48 is shown as a single device, controller 48 may include multiple controllers in the form of multiple hardware devices, or multiple software controllers with one or more hardware devices. In this regard, a reference to a "controller" herein may refer to one or more controllers.

Controller 48 implements a battery energy control module (BECM) 50. BECM 50 is in communication with traction battery 24. BECM 50 is a traction battery controller operable for managing the charging and discharging of traction battery 24 and for monitoring operating characteristics of the traction battery. BECM 50 is operable to implement algorithms to measure (e.g., detect or estimate) the operating characteristics of traction battery 24. BECM 50 controls the operation and performance of traction battery 24 based on the operating characteristics of the traction battery. The operation and performance of other systems and components of BEV 12 may be controlled based on the operating characteristics of traction battery 24.

Operating characteristics of traction battery 24 include the charge capacity and the state-of-charge (SOC) of traction battery 24. The charge capacity of traction battery 24 is indicative of the maximum amount of electrical energy that the traction battery may store. The SOC of traction battery 24 is indicative of a present amount of electrical charge stored in the traction battery. The SOC of traction battery 24 may be represented as a percentage of the maximum amount of electrical charge that may be stored in the traction battery.

Another operating characteristic of traction battery 24 is the power capability of the traction battery. The power capability of traction battery 24 is a measure of the maximum amount of power the traction battery can provide (i.e., discharge) or receive (i.e., charge) for a specified time period. As such, the power capability of traction battery 24 corresponds to discharge and charge power limits which define the amount of electrical power that may be supplied by or received by the traction battery at a given time. These limits can be provided to other vehicle controls, for example, through a vehicle system controller (VSC), so that the information can be used by systems that may draw power from or provide power to traction battery 24. Vehicle controls are to know how much power traction battery 24 can provide (discharge) or take in (charge) in order to meet the driver demand and to optimize the energy usage. As such, knowing the power capability of traction battery 24 allows electrical loads and sources to be managed such that the power requested is within the limits that the traction battery can handle.

Figure 2:
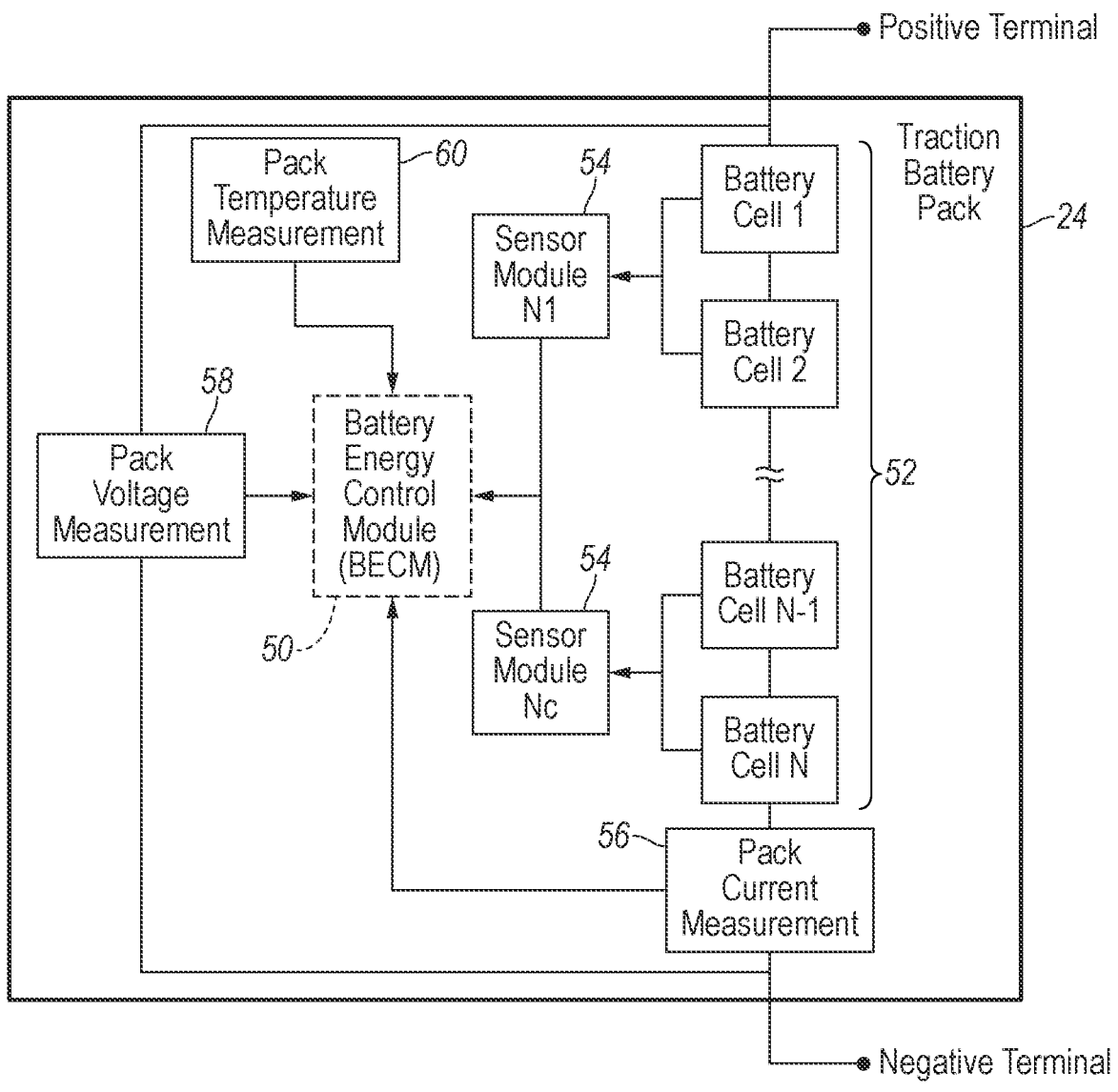
FIG. 2 illustrates a block diagram of an arrangement for a traction battery controller of the BEV to monitor a traction battery of the BEV.

Referring now to FIG. 2, with continual reference to FIG. 1, a block diagram of an arrangement for BECM 50 to monitor traction battery 24 is shown. Traction battery 24 is comprised of a plurality of battery cells 52. Battery cells 52 are physically connected together (e.g., connected in series as shown in FIG. 2).

BECM 50 is operable to monitor pack level characteristics of traction battery 24 such as battery current 56, battery voltage 58, and battery temperature 60. Battery current 56 is the current outputted (i.e., discharged) from or inputted (i.e., charged) to traction battery 24. Battery voltage 58 is the terminal voltage of traction battery 24.

BECM 50 is also operable to measure and monitor battery cell level characteristics of battery cells 52 of traction battery 24. For example, terminal voltage, current, and temperature of one or more of battery cells 52 may be measured. BECM 50 may use a battery sensor 54 to measure the battery cell level characteristics. Battery sensor 54 may measure the characteristics of one or multiple battery cells 52. BECM 50 may utilize Nc battery sensors 54 to measure the characteristics of all battery cells 52. Each battery sensor 54 may transfer the measurements to BECM 50 for further processing and coordination. Battery sensor 54 functionality may be incorporated internally to BECM 50.

Traction battery 24 may have one or more temperature sensors such as thermistors in communication with BECM 50 to provide data indicative of the temperature of battery cells 52 of traction battery 24 for the BECM to monitor the temperature of the traction battery and/or the battery cells. BEV 12 may further include a temperature sensor to provide data indicative of ambient temperature for BECM 50 to monitor the ambient temperature.

BECM 50 controls the operation and performance of traction battery 24 based on the monitored traction battery and battery cell level characteristics. For instance, BECM 50 may use the monitored characteristics to measure (e.g., detect or estimate) operating characteristics of traction battery 24 (e.g., the power capability of the traction battery, the SOC of the traction battery, and the like) such as for use in controlling the traction battery and/or BEV 12.

As known by those of ordinary skill in the art, BECM 50 may measure operating characteristics of traction battery 24 by using an observer, whereas a battery model (i.e., an "Equivalent Circuit Model" (ECM)) is used for construction of the observer, with measurements of battery current, terminal voltage, and battery temperature. BECM 50 may estimate values of parameters of the ECM (e.g., resistances and capacitances of circuit elements of the ECM) and values of states of the ECM (e.g., voltages and currents across circuit elements of the ECM) through recursive estimation based on such measurements. For instance, BECM 50 may use some adaptive estimation method, such as extended Kalman filter (EKF), to estimate the values of the model parameters and model states.

For the values of the operating characteristics of traction battery 24 measured by BECM 50 to be accurate with the actual values of the operating characteristics of the traction battery, the ECM has to accurately model the traction battery. For the ECM to accurately model traction battery 24, (i) the ECM has to have an adequate set of parameters (e.g., resistances and capacitances of circuit elements of the ECM) and (ii) the estimated values of the model parameters and model states have to be at least substantially similar to the values of the parameters and the states of an ECM that accurately models the traction battery (i.e., the estimated parameter and state values have to be at least substantially similar to the actual parameter and state values).

As set forth, an accurate model of traction battery 24 enables BECM 50 to properly control the traction battery which directly affects vehicle performance and driving range for a given full charge. Equivalent Circuit Models (ECMs) are widely used in electrified vehicle traction battery control systems in order to satisfy real time control system requirements for calculation speed and RAM/ROM usage. Particularly, an n-RC ECM where n=1 or 2 is widely used (an n-RC ECM is a type of ECM having "n" RC circuit elements each including a resistor ("R") parameter and a capacitor ("C") parameter; with n=1, a 1-RC ECM includes one such RC circuit element; and with n=2, a 2-RC ECM includes two such RC circuit elements). As indicated, the parameters for the ECM are learned with an online learning method such as Kalman Filter or Extended Kalman Filter (EKF).

The load of traction battery 24 varies in a wide frequency range over the course of use of BEV 12. For example, during local driving or when the driver has frequent increased/ decreased demands, the load of traction battery 24 varies within a few seconds. During highway cruise, the load of traction battery 24 may stay relatively constant for several minutes or longer. During a DC charge of traction battery 24, the load of the traction battery may be close to constant for a half hour or longer.

Battery diffusion is a continuous process that includes a wide frequency range as well. A high frequency range component mainly affects fast dynamic performance. The effect of slow frequency may be observed in relatively long time during one direction current flow condition such as during a charge depleting (CD) vehicle operation mode or a DC fast charging process.

1-RC and 2-RC ECMs are limited in modeling the traction battery diffusion process in a wide frequency range. To facilitate model state and parameter learning, the input signals (usually current) need be a dynamic load with sufficient "excitation" (a simpler form of explanation is that the current needs to have sufficient changes, other than a constant value) to the traction battery. This requirement has limited the use of an ECM that includes low frequency components whose parameters are to be identified via online learning. For 1-RC and 2-RC ECMs, they represent the higher frequency diffusion components. Due to this limitation, 1-RC and 2-RC ECMs are limited somewhat in accurately predicting the terminal voltage of the traction battery such as during the CD vehicle operation mode or the DC fast charging process.

Limitations of 1-RC and 2-RC ECMs may affect overall performance of traction battery control functions. For example, in battery model-based SOC estimation, the unmodelled part of the diffusion (as designated as higher numbered RC pairs) may ultimately distort the SOC estimation value due to the bias toward either higher diffusion voltage (positive) or lower diffusion voltage (negative). Using similar argument, the effect of the unmodelled diffusion dynamics may lead to over- or under-estimation of charge and discharge capabilities, especially at lower battery temperatures and/or at higher/lower SOC values.

In accordance with the present disclosure, BECM 50 employs an equivalent circuit model of traction battery 24 ("the proposed ECM") that efficiently represents complex battery diffusion dynamics of the traction battery. The proposed ECM can model the battery wide range frequency diffusion dynamics. In addition, the number of parameters of the proposed ECM are less than the number of parameters of multi-RC pairs ECMs having three or more RC circuit elements, and the parameters of the proposed ECM can be learned online using EKF or similar methods under reasonable BECM capabilities such as CPU utilization ratio and RAM/ROM availability.

The proposed ECM is able to accurately represent battery cell dynamics at low SOC and/or low temperature. Further, the proposed ECM is able to accurately estimate discharge power capability estimation at low SOC and/or low temperature and is able to accurately estimate charge power capability estimation at high SOC and/or low temperature.

The proposed ECM is different from multi-RC pairs ECMs having many more parameters which need to be identified or learned online, an impractical task with a multi-RC pairs ECM having three or more pairs of RC circuit elements (i.e., an n-RC ECM where n≥3). Instead of learning such many pairs of RC parameters, the proposed ECM only needs to learn the first RC pair which describes key parameters of the diffusion process. In other words, the proposed ECM has a complicated structure that is functionally compatible with n-RC pair ECMs (where n>>2), yet the parameters of the proposed ECM to be learned may be the same as those parameters used in the 1-RC model and are no more than the parameters used in the 2-RC model. In this way, the proposed ECM efficiently represents complex battery diffusion dynamics.

Figure 3:
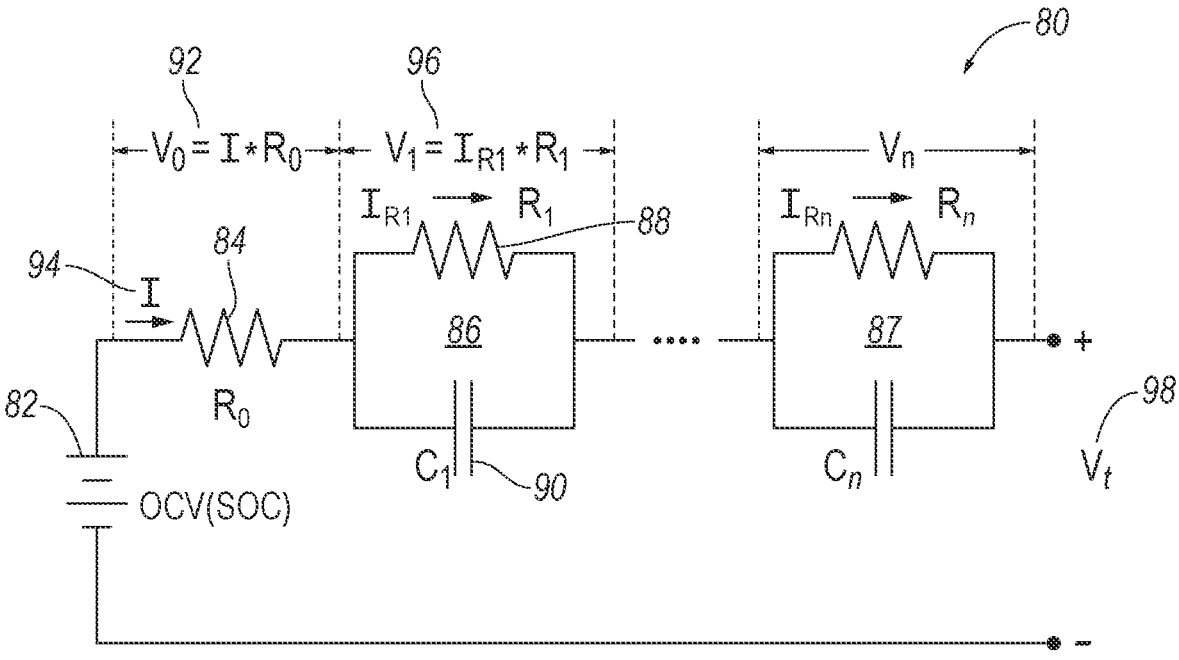
FIG. 3 illustrates a schematic diagram of a conventional equivalent circuit model (ECM) of the traction battery.

Referring now to FIG. 3, with continual reference to FIG. 1, a schematic diagram of a conventional ECM 80 of traction battery 24 is shown. Per conventional ECM 80, traction battery 24 is modeled as a circuit having in series a voltage source (OCV/(SOC)) 82, a resistor $R_0$ 84, a first RC pair 86 having a first resistor $R_1$ 88 and a first capacitor $C_1$ 90 connected in parallel, and one or more such additional RC pairs 87. As such, conventional ECM 80 is an n-RC ECM where n≥2.

Voltage source 82 represents the open-circuit voltage (OCV) of traction battery 24. The OCV of traction battery 24 depends on the state-of-charge (SOC) of the traction battery and the temperature of the traction battery. Resistor $R_0$ 84 represents an internal resistance of traction battery 24. The RC pairs represent the diffusion process of traction battery 24. As such, the diffusion process of traction battery 24 in conventional ECM 80 is described with RC pairs $R_1$ and $C_1$, ..., $R_n$ and $C_n$.

Voltage $V_0$ 92 is the voltage drop across resistor $R_0$ 84 due to battery current I 94 which flows across resistor $R_0$ 84. Voltage $V_1$ 96 is the voltage drop across first RC pair 86 due to battery current $IR_1$ which flows across resistor $R_1$ 88. A voltage drop is across each additional RC pair 87. Voltage $V_t$ 98 is the voltage across the terminals of traction battery 24 (i.e., the terminal voltage).

Parameters of conventional ECM 80 include the resistors (i.e., resistor $R_0$, resistor $R_1$, and resistor $R_n$) and the capacitors (i.e., capacitor $C_1$ and capacitor $C_n$). The parameters are to have values whereby the calculated output of conventional ECM 80 in response to a hypothetical given input is representative of the actual output of traction battery 24 in response to the actual given input. As such, the values of the parameters of conventional ECM 80 have to be accurate so that the ECM accurately models the behavior of traction battery 24.

The values of the parameters can be learned online by BECM 50 such as with an EKF. Understandably, it is much easier for BECM 50 to learn the values of a few parameters as opposed to learning the values of many parameters. Consequently, due to limitations of BECM hardware capabilities, conventional ECM 80 in conventional use is either only a 1-RC ECM or a 2-RC ECM.

Referring now to FIGS. 4A, 4B, 4C, and 4D, with continual reference to FIG. 3, further details of conventional ECM 80 will be described.

Figures 4A, 4B, 4C, 4D:
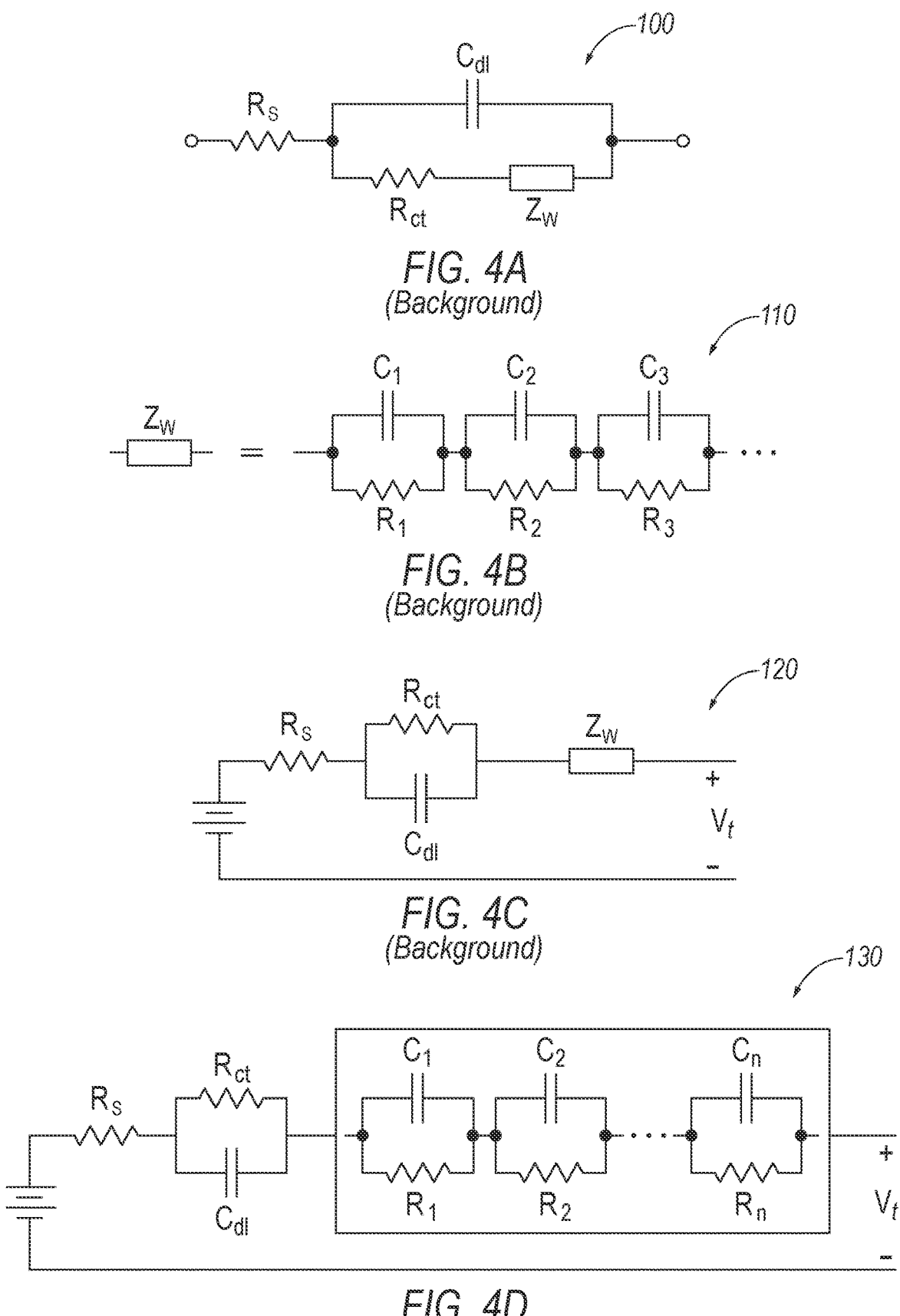
FIG. 4A illustrates a schematic diagram of a portion of the conventional ECM.
FIG. 4B illustrates a schematic diagram of a model for the Warburg impedance parameter of the portion shown in FIG. 4A.
FIG. 4C illustrates a schematic diagram of the conventional ECM with a simplified version of the portion shown in FIG. 4A.
FIG. 4D illustrates a schematic diagram of the conventional ECM shown in FIG. 4C with the Warburg impedance model shown in FIG. 4B replacing the Warburg impedance parameter.

FIG. 4A illustrates a schematic diagram of a portion 100 of conventional ECM 80. As indicated, ECM RC parameters can be linked to different cell physical properties, as shown in ECM portion 100 of FIG. 4A. In ECM portion 100, resistor $R_s$ is related to solid and electrolyte resistance of traction battery 24, resistor $R_{ct}$ is related to charge-transfer resistance (on double-layer), $C_{dl}$ is related to double-layer capacitance, and impedance $Z_W$ is the Warburg impedance that is used to describe cell diffusion in wide widespread frequency range diffusion.

FIG. 4B illustrates a schematic diagram of a model 110 for the Warburg impedance parameter ($Z_W$) of ECM portion 100. As there is no simple differential equation representing the Warburg impedance, multiple RC pairs are used to approximate the effect of the Warburg impedance as shown in Warburg impedance model 110.

FIG. 4C illustrates a schematic diagram of conventional ECM 80 with a simplified version of ECM portion 100. In the case of traction battery 24 being a lithium-ion traction battery, the double-layer capacitance $C_{dl}$ may be considered small enough for ECM portion 100 shown in FIG. 4A to be simplified thereby resulting in simplified conventional ECM 120 shown in FIG. 4C.

FIG. 4D illustrates a schematic diagram of simplified conventional ECM 120 shown in FIG. 4C with Warburg impedance model 110 shown in FIG. 4B replacing the Warburg impedance parameter. In the case of multiple RC pairs being used to represent the Warburg impedance, simplified conventional ECM 120 shown in FIG. 4C results in expanded conventional ECM 130 shown in FIG. 4D.

Expanded conventional ECM 130 shown in FIG. 4D accurately represents battery diffusion in wide widespread frequency range when the values of the parameters of multiple RC pairs can be determined accurately. However, because of the computation requirements due to the relatively large number of parameters, it is impracticable to be able to reliably calibrate the parameters, even in an offline optimization. As such, it is impractical to use expanded conventional ECM 130 in an operating vehicle with an EKF to determine the values of the RC parameters.

In accordance with the present disclosure, the proposed ECM is based on defining the RC parameters in multiple RC pairs representing the Warburg impedance (shown in Warburg impedance model 110 of FIG. 4B) as being dependent on the first RC pair having the lowest time constant ($\tau$). The first RC pair having the lowest time constant ($\tau$) is the RC pair comprised of resistor $R_1$ and capacitor $C_1$, where the time constant ($\tau_1$) is equal to the product of the resistance and the capacitance of the RC pair per the equation $\tau_1 = R_1 * C_1$. The resistors of the other RC pairs are functions of the resistor $R_1$ of the first RC pair, expressed as fs( ). The time constants ($\tau$) of the other RC pairs are functions of the time constant ($\tau_1$), expressed as gs( ).

Physics behind the proposed ECM is simple. Instead of trying to find n-pairs of lower frequency RC pairs to describe the battery diffusion dynamics, which is an approximation after all, a simpler form of expression is used to discretely cover the intended frequency domain, while at the same time making sure the ECM is accurate enough, at least comparable to a full n-RC pair model with sophisticated model structure and parameters.

The functions fs( ) and gs( ), which link the parameters in n-RC pairs, are determined offline. The relationships are kept constant during real time control of traction battery 24 by BECM 50. These functions may be updated such as after extended usage of traction battery 24.

When this Warburg impedance is used in expanded conventional ECM 130 of FIG. 4D, there is only one pair of RC parameters (namely, the first RC pair) whose values need to be determined as the RC parameters in the other pairs of this Warburg impedance are dependent on the parameters of the first RC pair.

The functions of $f_1( )$, $f_2( )$, . . . and $f_n( )$ determine how the resistance values of the other RC pairs depend on the resistance value of resistor $R_1$ of the first RC pair. The resistance values in the other RC pairs can be set the same or can be assumed to be different. The dependency may also be functions of temperature and battery current, which means $R_2=f_1(R_1, T, I)$, $R_3=f_2(R_1, T, I)$, . . . and $R_{n+1}=f_n(R_1, T, I)$.

In further detail, in conventional ECM 80 shown in FIG. 3, resistors $R_1$, $R_2$, . . . $R_n$ are not independent parameters. In contrast, in the proposed ECM it is provided that only one of the resistors (e.g., $R_1$) is an independent parameter with the remaining resistors (e.g., $R_2$, . . . $R_n$) being parameters dependent thereon. In this example, the dependency of the resistors $R_2$, . . . $R_n$ on the resistor $R_1$ is set forth by the functions $f_1( )$, $f_2( )$, . . . and $f_n( )$ (i.e., $R_2=f_1(R_1, T, I)$, $R_3=f_2(R_1, T, I)$, . . . and $R_{n+1}=f_n(R_1, T, I)$.

The functions of $g_1( )$, $g_2( )$, . . . and $g_n$ (determine how the frequency range is spread. These functions assure that each RC pair covers a frequency range, and that they do not overlap each other. These relationships are to assure that $\tau_2>3\tau_1$, $\tau_3>3\tau_2$, . . . $\tau_n>3\tau_{n-1}$. The dependency may also be functions of temperature and battery current, which means $C_2=g_1(\tau_1, T, I)$, $C_3=g_2(\tau_1, T, I)$, . . . $C_{n+1}=g_n(\tau_1, T, I)$.

For use in controlling current types of traction batteries with the proposed ECM, n=5 or 6 is a viable option.

Figure 5:
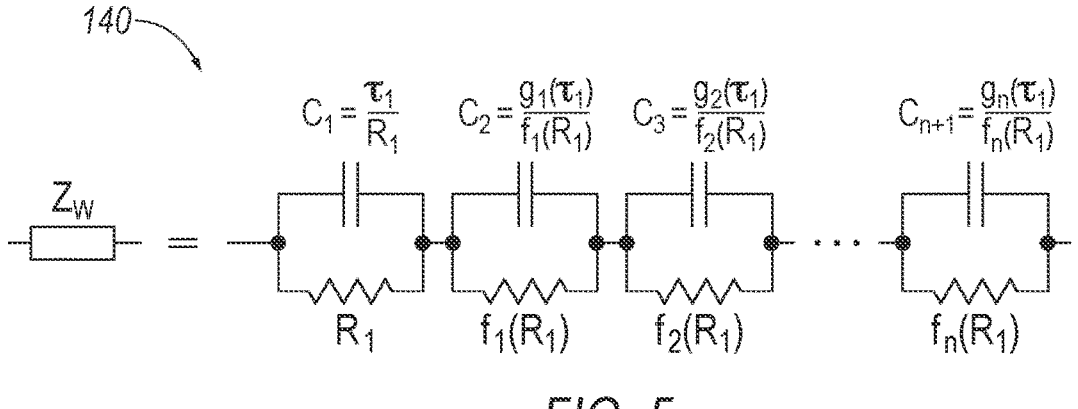
FIG. 5 illustrates a schematic diagram of a proposed model for the Warburg impedance parameter.

Referring now to FIG. 5, with continual reference to the preceding Figures, a schematic diagram of a proposed model 140 for the Warburg impedance parameter ($Z_W$) is shown. In the proposed ECM, proposed Warburg impedance model 140 replaces Warburg impedance model 110 shown in FIG. 4B.

Proposed Warburg impedance model 140 may be referred to as an independent 2-RC pair as the proposed Warburg impedance model has only two RC pairs that have parameters independent of the other pairs. As an example, assume the functions of $f_1=f_2=f_3=$ . . . , which make $R_1=R_2=R_3=$ . . . , and $\tau_2=[\gamma(T, I)*\tau_1] *\tau_1=\gamma(T, I)\tau_1^2$, $\tau_3=\alpha\gamma(T, I)\tau_1^2$, $\tau_4=\alpha^2\gamma(T, I)\tau_1^2$, $\tau_5=\alpha^3\gamma(T, I)\tau_1^2$, . . . , n=$\alpha^{n-2}\gamma(T, I)\tau_1^2$, where $\alpha$ is a constant parameter greater than three and $\gamma(T, I)$ is a function of temperature (T) and current (I). $\gamma$ can also be a constant with the unit 1/s. $\alpha$ and $\gamma$ are identified offline with test data and do not change during battery operation but may be updated after extensive battery use.

Figure 6:
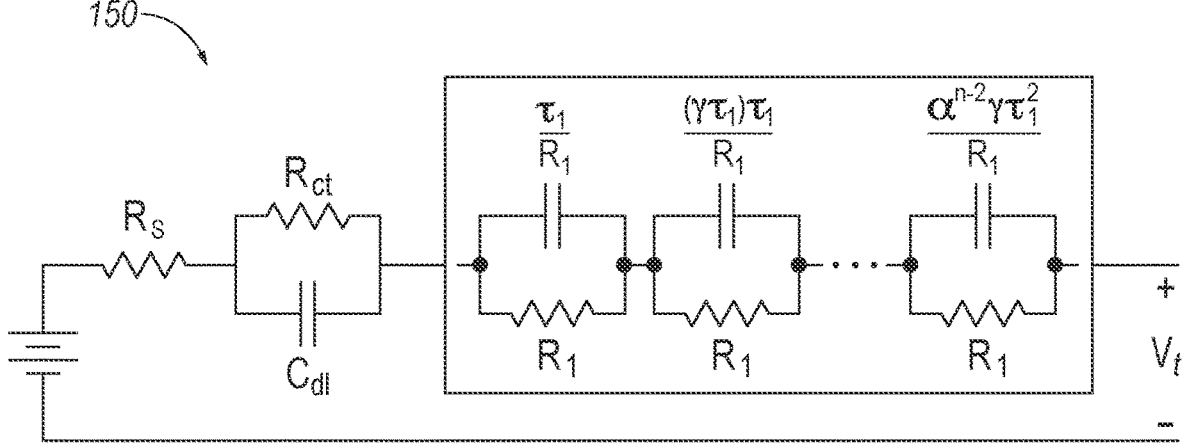
FIG. 6 illustrates a schematic diagram of a proposed ECM of the traction battery, the proposed ECM including the proposed model for the Warburg impedance parameter.

Referring now to FIG. 6, with continual reference to FIG. 5, a schematic diagram of proposed ECM 150 of traction battery 24 is shown. When the above relations are applied and let $\gamma=1$ (1/sec), the independent 2-RC model becomes proposed ECM 150 shown in FIG. 6. As shown in FIG. 6, proposed ECM 150 has only five RC parameters, $R_s$, $R_{ct}$, $C_{dl}$ (or $\tau_{dl}=R_{ct}C_{dl}$), $R_1$, and $\tau_1$ for BECM 50 to learn. The amount of five RC parameters is the same number of parameters of the conventional 2-RC pair ECM. Another advantage for proposed ECM 150 is that the values of the parameters can be learned with dynamic load even though the parameters described the low-frequency properties of the battery cells.

In proposed ECM 150 shown in FIG. 6, the first RC pair describes battery charge transfer properties of double layer capacitance. Its frequency response is much faster than that of the first RC pair of the Warburg impedance which represents the cell diffusion properties. Therefore, during the model parameter determination, a high bound of $\tau_{dl}$ limit is applied for $\tau_{dl}$ and a low bound of $\tau_1$ is applied for $\tau_1$. The bounds may be temperature dependent. The high bound of $\tau_{dl}$ should be distinguishably smaller than the low bound of $\tau_1$.

Figure 7:
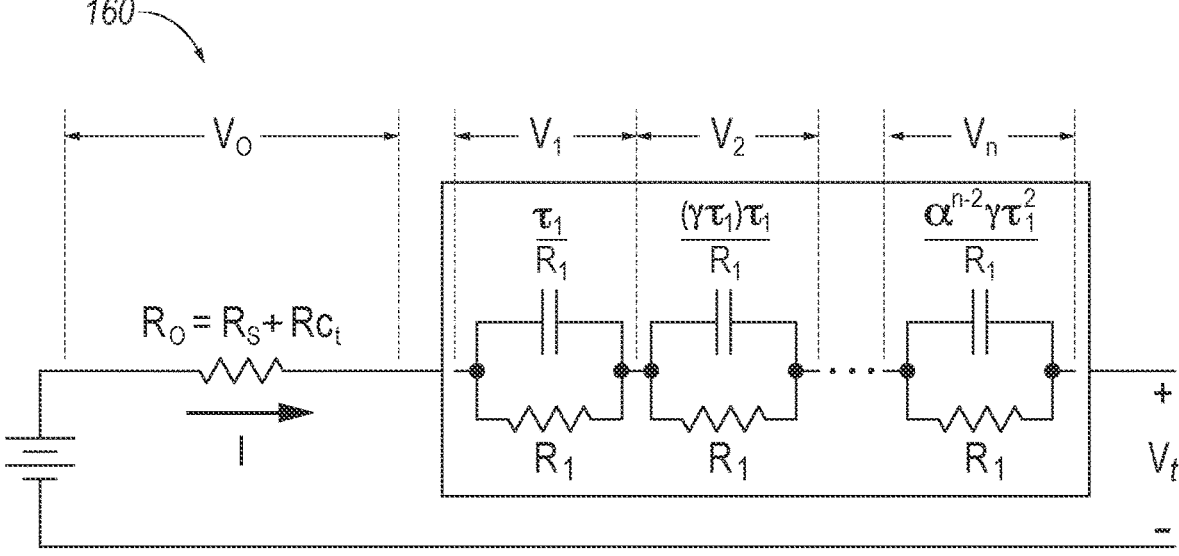
FIG. 7 illustrates a schematic diagram of the proposed ECM in the form of an independent 1-RC ECM.

Referring now to FIG. 7, with continual reference to FIG. 6, a schematic diagram of proposed ECM 150 in the form of an independent 1-RC ECM 160 is shown. Independent 1-RC ECM 160 is derived as follows. For a lithium-ion traction battery, the $C_{dl}$ is relatively small. As a result, the time constant ($\tau_{dl}=R_{ct}C_{dl}$) of this RC pair is much smaller than one second in the temperature range the traction battery is normally operated. It can only reach about one second at extreme cold temperature such as $-30°$ C. or colder. When the effect of $C_{dl}$ is neglected, proposed ECM 150 does not affect five seconds or above duration power estimation at all temperatures and may have small and neglectable effect on one second power estimation in $-20°$ C. or colder. Therefore, proposed ECM 150 can be further simplified to independent 1-RC ECM 160 shown in FIG. 7.

Independent 1-RC ECM 160 has only three RC parameters, $R_0$, $R_1$, and $\tau_1$ for BECM 50 to learn. The amount of three RC parameters is the same number of parameters of the conventional 1-RC pair ECM.

When $C_{dl}$ is neglected, the first RC pair of independent 1-RC ECM 160 describes the cell diffusion properties instead of double layer behavior. During the model parameter determination, a lower bound limit, which depends on temperature, is applied for $\tau_1$, to make it within the cell diffusion frequency range.

When proposed model 150 is used in BECM 50, for the independent 2-RC ECM the values of $R_s$, $R_{ct}$, $C_{dl}$ (or $\tau_{dl}$), $R_1$, and $\tau_1$ are estimated with some adaptive scheme such as EKF during vehicle operation, and for the independent 1-RC ECM, the values of $R_0$, $R_1$, and $\tau_1$ are estimated with some adaptive scheme.

As an example of proposed ECM 150, independent 1-RC ECM 160 is shown in FIG. 7 with defined current direction and voltages indicated therein. The traction battery function can be expressed as (let $\gamma=1$ (1/s)):

$$V_t = OCV - V_0 - V_1 - V_2 - \ldots - V_n$$

$$\frac{dV_1}{dt} = -\frac{1}{\tau_1}V_1 + \frac{R_1}{\tau_1}I$$

$$\frac{dV_2}{dt} = -\frac{1}{\gamma\tau_1^2}V_1 + \frac{R_1}{\gamma\tau_1^2}I$$

$$\ldots$$

$$\frac{dV_n}{dt} = -\frac{1}{\alpha^{n-2}\gamma\tau_1^2}V_1 + \frac{R_1}{\alpha^{n-2}\gamma\tau_1^2}I$$

To facilitate online estimation, the parameters are designated as state variables that can be learned with online learning method such as Extended Kalman filter. For example, the proposed independent n-RC ECM can be expressed as below. Here, SOC and $V_1(t)$ are states and $R_0$, $R_1$, $\tau_1$ are parameters to be learned.

$$\begin{bmatrix} \dfrac{dSOC(t)}{dt} \\ \dfrac{dV_1(t)}{dt} \\ \dfrac{dV_2(t)}{dt} \\ \vdots \\ \dfrac{dV_n(t)}{dt} \\ \dfrac{dR_0(t)}{dt} \\ \dfrac{dR_1(t)}{dt} \\ \dfrac{d\tau_1(t)}{dt} \end{bmatrix} = \begin{bmatrix} 0 & 0 & 0 & 0 & \dots & 0 & 0 & 0 & 0 \\ 0 & -\dfrac{1}{\tau_1} & 0 & 0 & \dots & 0 & 0 & 0 & 0 \\ 0 & 0 & -\dfrac{1}{\tau_2} & 0 & \dots & 0 & 0 & 0 & 0 \\ 0 & 0 & 0 & \vdots & 0 & 0 & 0 & 0 \\ 0 & 0 & 0 & 0 & \dots & -\dfrac{1}{\tau_n} & 0 & 0 & 0 \\ 0 & 0 & 0 & 0 & \dots & 0 & 0 & 0 & 0 \\ 0 & 0 & 0 & 0 & \dots & 0 & 0 & 0 & 0 \\ 0 & 0 & 0 & 0 & \dots & 0 & 0 & 0 & 0 \end{bmatrix} \begin{bmatrix} SOC \\ V_1 \\ V_2 \\ \vdots \\ V_n \\ R_0 \\ R_1 \\ \tau_1 \end{bmatrix} + \begin{bmatrix} -\dfrac{1}{Q} \\ \dfrac{R_1}{\tau_1} \\ \dfrac{R_2}{\tau_2} \\ \vdots \\ \dfrac{R_n}{\tau_n} \\ 0 \\ 0 \\ 0 \end{bmatrix} * I(t) + w(t)$$

$$V(t) = OCV(t) - R_0 * I(t) - V_1(t) - V_2(t) - V_3(t) - \dots V_n(t) + \mu(t)$$

$$= f(SOC(t)) - R_0 * I(t) - V_1(t) - V_2(t) - V_3(t) - \dots V_n(t) + \mu(t)$$

Where $V_1(t)$, $V_2(t)$, $V_3(t)$, and $V_n(t)$ all are functions of $R_1$ and $\tau_1$, etc.

They are calculated via:

$$V_i(t_k) = I(t_k)R_i\left(1 - e^{-\frac{dt}{\tau_i}}\right) + V_i(t_{k-1})$$

The above state function is as simple as what is used for the conventional 1-RC ECM.

A further simplified approach is to use direct open loop calculation for $V_2$, $V_3$, $\dots V_n$ as long as their initial values are considered known. This is a special case and shall not be extended to generic vehicle operation scenarios, as traction batteries are not always rested to have zero initial value for $V_2$, $V_3$, $\dots$, for example.

BECM 50 can estimate the power of traction battery 24 with the estimated states SOC, $V_1$, $V_2$, $\dots$, $V_n$ and the learned parameters $R_0$, $R_1$, $\tau_1$.

With proposed ECM 150, BECM 50 can derive the battery current limit for discharge as:

$$i = \frac{OCV - V_t - V_1(0)e^{-\frac{t}{\tau_1}} - V_2(0)e^{-\frac{t}{\tau_2}} - V_3(0)e^{-\frac{t}{\tau_3}} \dots - V_n(0)e^{-\frac{t}{\tau_n}}}{R_0 + R_1\left(1 - e^{-\frac{t}{\tau_1}}\right) + R_2\left(1 - e^{-\frac{t}{\tau_2}}\right) + \dots R_n\left(1 - e^{-\frac{t}{\tau_n}}\right)}$$

Where $V_t$ is the battery terminal voltage, $V_1(0)$, $V_2(0)$, $\dots V_n(0)$ are the voltages shown in FIG. 7 at time t=0 or at the moment when power estimation is updated. $\tau_2$, $\tau_3$, $\dots \tau_3$ are functions of $\tau_1$, and $R_2$, $R_3$, $\dots R_n$ are functions of $R_1$.

During the discharge case (with the assumption that the discharge current is positive), BECM 50 determines the discharge current limit by:

$$i\_max = \frac{OCV - V_{tmin} - V_1(0)e^{-\frac{t}{\tau_1}} - V_2(0)e^{-\frac{t}{\tau_2}} - V_3(0)e^{-\frac{t}{\tau_3}} \dots - V_n(0)e^{-\frac{t}{\tau_n}}}{R_0 + R_1\left(1 - e^{-\frac{t}{\tau_1}}\right) + R_2\left(1 - e^{-\frac{t}{\tau_2}}\right) + \dots R_n\left(1 - e^{-\frac{t}{\tau_n}}\right)}$$

Where $V_{tmin}$ is the traction battery minimum voltage limit. The voltage under the maximum discharge current will be:

$$V_t dis = OCV - \left[V_1(0)e^{-\frac{t}{\tau_1}} + V_2(0)e^{-\frac{t}{\tau_2}} + V_3(0)e^{-\frac{t}{\tau_3}} \dots + V_n(0)e^{-\frac{t}{\tau_n}}\right] - i_{dis},$$

$$limit\left[R_0 + R_1\left(1 - e^{-\frac{t}{\tau_1}}\right) + R_2\left(1 - e^{-\frac{t}{\tau_2}}\right) + \dots R_n\left(1 - e^{-\frac{t}{\tau_n}}\right)\right]$$

The discharge power capability at time t second later will be:

$$P_{cap_{dis}}(t) = \begin{cases} i\_max * V\_min & \text{if } i\_max < i_{dis}, \text{ limit} \\ i_{dis}, \text{ limit} * V_t dis & \text{Otherwise} \end{cases}$$

During charge (with the assumption that the charge current is negative, the maximum charge current will be the minimum current):

$$i\_min = \frac{Ocv - V_{tmax} - V_1(0)e^{-\frac{t}{\tau_1}} - V_2(0)e^{-\frac{t}{\tau_2}} - V_3(0)e^{-\frac{t}{\tau_3}} \dots - V_n(0)e^{-\frac{t}{\tau_n}}}{R_0 + R_1\left(1 - e^{-\frac{t}{\tau_1}}\right) + R_2\left(1 - e^{-\frac{t}{\tau_2}}\right) + \dots R_n\left(1 - e^{-\frac{t}{\tau_n}}\right)}$$

Where $V_{tmax}$ is battery maximum voltage limit. The voltage under the maximum charge current will be:

$$V_t ch = Ocv - \left[V_1(0)e^{-\frac{t}{\tau_1}} + V_2(0)e^{-\frac{t}{\tau_2}} + V_3(0)e^{-\frac{t}{\tau_3}} \dots + V_n(0)e^{-\frac{t}{\tau_n}}\right] - i_{ch},$$

$$limit\left[R_0 + R_1\left(1 - e^{-\frac{t}{\tau_1}}\right) + R_2\left(1 - e^{-\frac{t}{\tau_2}}\right) + \dots R_n\left(1 - e^{-\frac{t}{\tau_n}}\right)\right]$$

BECM 50 can get the charge power capability at time t second later by:

$$P_{cap_{dis}}(t) = \begin{cases} abs(i\_min) * V\_max & \text{if } abs(i\_min) < i_{ch}, \text{ limit} \\ i_{ch}, \text{ limit} * V_t ch & \text{Otherwise} \end{cases}$$

Figure 8:
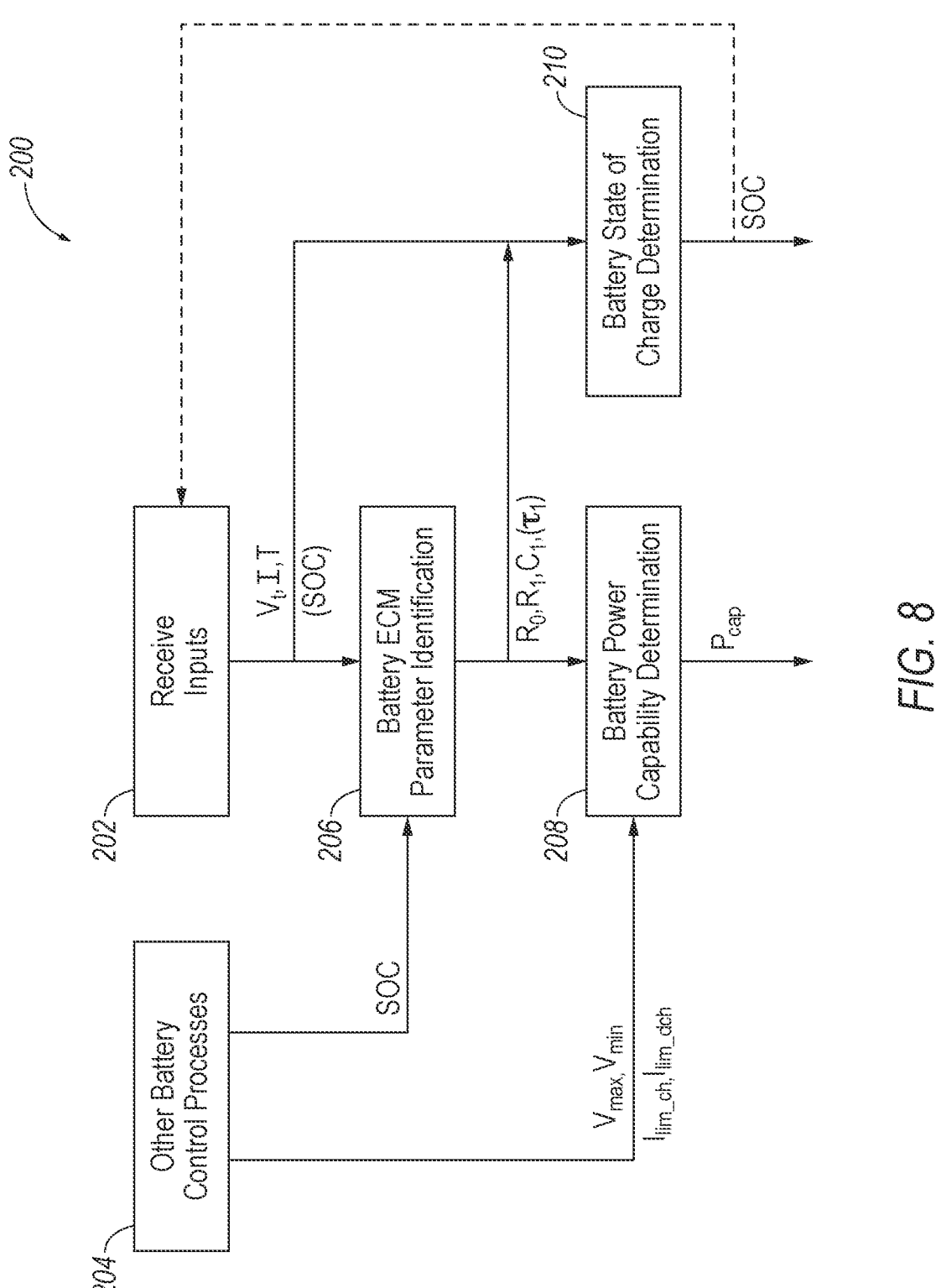
FIG. 8 illustrates a flowchart describing operation carried out by the traction battery controller in using the independent 1-RC ECM to detect the power capability of the traction battery and/or the state-of-charge (SOC) of the traction battery.

Referring now to FIG. 8, a flowchart 200 describing operation carried out by BECM 50 in using independent 1-RC ECM 160 to detect the power capability and/or the SOC of traction battery 24 is shown.

In process block 202, BECM 50 receives input that is indicative of traction battery voltage ($V_t$), traction battery current (I), and traction battery temperature (T). The input is measured by sensors as described above. The input may further include a previously estimated SOC, as represented by a dashed line in flowchart 200.

In process block 204, BECM 50 determines battery control parameters, such as the SOC and battery voltage and current limits ($V_{max}$, $V_{min}$, $I_{lim\_ch}$, $I_{lim\_dch}$). BECM 50 may calculate the SOC using the ampere-hour-integration method.

In process block 206, BECM 50 estimates the values of the parameters of independent 1-RC ECM 160 (i.e., values of $R_0$, $R_1$, and $\tau_1$) using a recursive parameter estimation algorithm with an EKF. The EKF uses the measured voltage, current, and temperature of traction battery 24 in the recursive parameter estimation algorithm for estimating the ECM parameters. The SOC, which may be provided by process blocks 202 or 204, may also be used in estimating the ECM battery parameters.

In process block 208, BECM 50 estimates the power capability ($P_{cap}$) of traction battery 24. With knowledge of the estimated ECM battery parameters, BECM 50 utilizes known equations for estimating the charging and discharging battery power capability, respectively. BECM 50 controls traction battery 24 and/or BEV 12 according to the estimated power capability of the traction battery.

In process block 210, BECM 50 estimates the SOC of traction battery 24. Likewise, with knowledge of the estimated ECM battery parameters, BECM 50 utilizes known equations for estimating the SOC. BECM 50 controls traction battery 24 and/or BEV 12 according to the estimated SOC of the traction battery.

As described, in accordance with the present disclosure, BECM 50 employs the proposed ECM which efficiently represents complex diffusion dynamics of traction battery 24. In the proposed ECM, the Warburg impedance is represented by multiple RC pairs with the parameters in each pair other than one pair (i.e., the first pair) depending on the first pair having smallest time constant (highest frequency). Particularly, the resistance of each RC pair depends on the resistance of the first RC pair. The dependence of the other RC pairs on the first RC pair may change with temperature, SOC, and/or current.

Among multiple RC pairs, each RC pair covers a frequency range, from DC to essentially infinity, if needed. Such frequency ranges do not overlap each other. The smallest time constant in the first RC pair may be at least several second longer than that from pairs consisted by charge transfer resistance and double layer capacity to allow the two pairs to be separated clearly. The time constants of these nRC pairs should be different, each represent a different frequency. The frequency range they represent includes higher frequency of vehicle dynamic load to low frequency of constant charge/discharge from 0% to 100%/(100% to 0%). The time constants of all RC pairs other than the first pair depend on the time constant of first RC pair. Such dependency function may be a function of time constant of the first RC pair only. It may also depend on temperature, SOC, and/or current.

Only the first RC parameters are learned by BECM 50. BECM 50 calculates the parameters of RC pairs other than the first RC pair by predetermined relationships with the parameters of the first RC pair. The relationship of the parameters among the first RC pair and other RC pairs are developed offline and dependent relationships are fixed during vehicle operation and in a relative longer vehicle use time. Such dependency functions can be updated with battery life.

The method of power capability estimation employed by BECM 50 is provided with relation to the RC pair parameters, battery SOC, and charge/discharge voltage limits, as well as current limit map, if any.

The proposed ECM can be extended to other battery pack control structures for battery packs with multiple cells connected in series.

While exemplary embodiments are described above, it is not intended that these embodiments describe all possible forms of the present disclosure. Rather, the words used in the specification are words of description rather than limitation, and it is understood that various changes may be made without departing from the spirit and scope of the present disclosure. Additionally, the features of various implementing embodiments may be combined to form further embodiments of the present disclosure.

What is claimed is:

1. A system comprising:
a battery; and
a real time controller configured to charge and discharge the battery according to charge and discharge power limits based on a power capability of the battery, the power capability of the battery being based on (i) a value of a first parameter of a model of the battery taken from electrical measurements of the battery and (ii) a value of a second parameter of the model, dependent on and taken from the value of the first parameter; and
wherein the model includes a first resistor-capacitor (RC) circuit and a second RC circuit, the first parameter is a resistor of the first RC circuit and the value of the first parameter is a value of a resistance of the resistor of the first RC circuit, the second parameter is a resistor of the second RC circuit and the value of the second parameter is a value of a resistance of the resistor of the second RC circuit, and the first RC circuit has a time constant that is smaller than a time constant of the second RC circuit.

2. The system of claim 1 wherein:
the controller is further configured charge and discharge the battery according to the charge and discharge power limits of the power capability of the battery based on (i) the value of the first parameter, (ii) the value of the second parameter, and (iii) a value of one or more additional parameters of the model, dependent on the value of the first parameter, taken from the value of the first parameter.

3. The system of claim 2 wherein:
the first parameter, the second parameter, and the one or more additional parameters are indicative at least in part of a Warburg impedance of the model.

4. The system of claim 1 wherein:
the dependence of the value of the second parameter on the value of the first parameter changes with changes in a temperature of the battery, a current of the battery, and a state-of-charge (SOC) of the battery.

5. The system of claim 1 wherein:
the electrical measurements of the battery include voltage and/or current and/or temperature measurements of the battery.

6. A system of a vehicle having a traction battery, the system comprising:
a sensor configured to sense electrical measurements of the traction battery; and
a real time controller configured to charge and discharge the traction battery according to charge and discharge power limits based on a power capability of the traction battery, the power capability of the traction battery being based on (i) a value of a first resistor-capacitor (RC) circuit of an equivalent circuit model (ECM) of the traction battery taken from the electrical measurements of the traction battery and (ii) a value of a second RC circuit of the ECM, dependent on and taken from the value of the first RC circuit; and
wherein the first parameter is a resistor of the first RC circuit and the value of the first parameter is a value of a resistance of the resistor of the first RC circuit, the second parameter is a resistor of the second RC circuit and the value of the second parameter is a value of a resistance of the resistor of the second RC circuit, and the first RC circuit has a time constant that is smaller than a time constant of the second RC circuit.

7. The system of claim 6 wherein:
the controller is further configured to charge and discharge the traction battery according to the charge and discharge power limits of the power capability of the traction battery based on (i) the value of the first RC circuit, (ii) the value of the second RC circuit, and (iii) a value of one or more additional RC circuits of the ECM, dependent on the value of the first parameter, taken from the value of the first RC circuit.

8. The system of claim 7 wherein:
the first RC circuit, the second RC circuit, and the one or more additional RC circuits are indicative at least in part of a Warburg impedance of the ECM.

9. The system of claim 7 wherein:
the first RC circuit has a smallest time constant amongst all RC circuits of the ECM.

10. The system of claim 9 wherein:
the second RC circuit has a smallest time constant amongst all RC circuits of the ECM other than the first RC circuit.

11. A method comprising:
sensing electrical measurements of a traction battery of a vehicle; and
charging and discharging, by a real time controller, the traction battery according to charge and discharge power limits based on a power capability of the traction battery, the power capability of the traction battery being based on (i) a value of a first parameter of an equivalent circuit model (ECM) of the traction battery taken from the electrical measurements of the traction battery and (ii) a value of a second parameter of the ECM, dependent on and taken from the value of the first parameter;
wherein the first parameter is a resistor of a first resistor-capacitor (RC) circuit of the ECM and the value of the first parameter is a value of a resistance of the resistor of the first RC circuit, the second parameter is a resistor of a second RC circuit of the ECM and the value of the second parameter is a value of a resistance of the resistor of the second RC circuit, and the first RC circuit has a time constant that is smaller than a time constant of the second RC circuit.

12. The method of claim 11 further comprising:
charging and discharging, by the controller, the traction battery according to the charge and discharge power limits of the power capability of the traction battery based further on (iii) a value of one or more additional parameters of the ECM, dependent on the value of the first parameter, taken from the value of the first parameter.

* * * * *